(12) United States Patent
Cho et al.

(10) Patent No.: US 9,349,992 B2
(45) Date of Patent: May 24, 2016

(54) METHODS OF FORMING AN ORGANIC SCATTERING LAYER, AN ORGANIC LIGHT EMITTING DIODE WITH THE SCATTERING LAYER, AND A METHOD OF FABRICATING THE ORGANIC LIGHT EMITTING

(71) Applicants: ELECTRONICS AND TELECOMMUNICATIONS RESEARCH INSTITUTE, Daejeon (KR); UNITEX Co., LTD, Gyeonggi-do (KR)

(72) Inventors: Nam Sung Cho, Daejeon (KR); Jeong Ik Lee, Gyeonggi-do (KR); Joo Hyun Hwang, Seoul (KR); Chul Woong Joo, Seoul (KR); Jun-Han Han, Deajeon (KR); Seung Koo Park, Daejeon (KR); Jaehyun Moon, Daejeon (KR); Doo-Hee Cho, Daejeon (KR); Jin Wook Shin, Incheon (KR); Hye Yong Chu, Daejeon (KR); Seongdeok Ahn, Daejeon (KR); Jin Woo Huh, Daejeon (KR); Myung Gi Lee, Gyeonggi-do (KR); Kyung Soo Suh, Daejeon (KR); Byoung Gon Yu, Chungcheongbuk-do (KR)

(73) Assignees: ELECTRONICS AND TELECOMMUNICATIONS RESEARCH INSTITUTE, Daejeon (KR); UNITEX CO., LTD, Gyeonggi-Do (KR)

( * ) Notice: Subject to any disclaimer, the term of this patent is extended or adjusted under 35 U.S.C. 154(b) by 0 days.

(21) Appl. No.: 14/860,659

(22) Filed: Sep. 21, 2015

(65) Prior Publication Data

US 2016/0013448 A1    Jan. 14, 2016

Related U.S. Application Data

(62) Division of application No. 14/020,471, filed on Sep. 6, 2013, now abandoned.

(30) Foreign Application Priority Data

Nov. 26, 2012 (KR) ......................... 10-2012-0134655

(51) Int. Cl.
| | |
|---|---|
| *H01L 33/22* | (2010.01) |
| *H01L 51/52* | (2006.01) |
| *G02B 5/02* | (2006.01) |
| *C23C 14/12* | (2006.01) |
| *H01L 51/56* | (2006.01) |

(52) U.S. Cl.
CPC ............ *H01L 51/5268* (2013.01); *C23C 14/12* (2013.01); *G02B 5/0242* (2013.01); *G02B 5/0247* (2013.01); *H01L 51/56* (2013.01); *H01L 2251/5315* (2013.01)

(58) Field of Classification Search
CPC . H01L 51/30; H01L 51/5268; H01L 51/5275; C23C 16/303; C23C 16/4401
USPC ............... 438/285, 641, 32, 29, 99, 513, 905; 257/40, 79, E39.007, 98, E21.272, 257/E21.108, E21.121, E21.131; 313/116, 313/474, 506
See application file for complete search history.

(56) References Cited

U.S. PATENT DOCUMENTS

| | | | | |
|---|---|---|---|---|
| 2002/0053401 | A1* | 5/2002 | Ishikawa | H01L 27/3244 156/309.3 |
| 2004/0062862 | A1 | 4/2004 | Ahn et al. | |
| 2007/0259502 | A1* | 11/2007 | Bour | C23C 16/303 438/285 |
| 2007/0267966 | A1* | 11/2007 | Numajiri | B32B 7/02 313/502 |
| 2012/0292604 | A1* | 11/2012 | Lee | H05B 33/10 257/40 |

FOREIGN PATENT DOCUMENTS

| | | |
|---|---|---|
| KR | 10-0473806 B1 | 3/2005 |
| KR | 10-2007-0102947 A | 10/2007 |
| KR | 10-1081499 B1 | 11/2011 |

OTHER PUBLICATIONS

G. Gu, "High-external-quantum-efficiency organic light-emitting devices", Optics Letters, vol. 22, No. 6, pp. 396-398, Mar. 15, 1997.

\* cited by examiner

*Primary Examiner* — David Vu
*Assistant Examiner* — Mouloucoulaye Inoussa
(74) *Attorney, Agent, or Firm* — Rabin & Berdo, P.C.

(57) ABSTRACT

Provided is a method of fabricating an organic scattering layer. The method may include providing a deposition apparatus with a reaction chamber and a source chamber, loading a substrate in the reaction chamber, supplying carrier gas into the source chamber that may be configured to supply an evaporated organic source material into the reaction chamber, a temperature of the carrier gas ranging from 25° C. to 50° C., and spraying the carrier gas and the evaporated organic source material into the reaction chamber through a showerhead to deposit an organic scattering layer on the substrate, the organic scattering layer including organic particles, which may be provided in a molecularized form of the evaporated organic source material, and thereby having an uneven surface.

9 Claims, 6 Drawing Sheets

US 9,349,992 B2

METHODS OF FORMING AN ORGANIC SCATTERING LAYER, AN ORGANIC LIGHT EMITTING DIODE WITH THE SCATTERING LAYER, AND A METHOD OF FABRICATING THE ORGANIC LIGHT EMITTING

CROSS-REFERENCE TO RELATED APPLICATIONS

This is a divisional of co-pending U.S. application Ser. No. 14/020,471, filed on Sep. 6, 2013. This U.S. non-provisional patent application claims priority under 35 U.S.C. §119 to Korean Patent Application No. 10-2012-0134655, filed on Nov. 26, 2012, in the Korean Intellectual Property Office. The contents of the prior U.S. and Korean applications are hereby incorporated by reference.

BACKGROUND OF THE INVENTION

Example embodiments of the inventive concept relate to an organic light-emitting diode, and in particular, to methods of forming an organic scattering layer, an organic light emitting diode with the scattering layer, and a method of fabricating the organic light emitting diode.

There is an increasing demand for organic light-emitting diode (OLED) displays. The organic light-emitting diode display provides several technical advantages, such as high display efficiency, high color gamut, and transparency. In addition, the organic light-emitting diode can be fabricated in the form of a thin film, and thus, it can be used to realize a flexible display. The organic light-emitting diode is widely used for a display of a portable device, and it is expected to be used in large-area television screens in the near future. However, the organic light-emitting diode suffers from low external quantum efficiency of about 20%.

SUMMARY

Example embodiments of the inventive concept provide a method of forming an organic scattering layer at low temperature.

Other example embodiments of the inventive concept provide an organic light-emitting diode with improved efficiency.

Still other example embodiments of the inventive concept provide a method of fabricating an organic light-emitting diode with improved efficiency.

According to example embodiments of the inventive concepts, a method of fabricating an organic scattering layer may include providing a deposition apparatus with a reaction chamber and a source chamber, loading a substrate in the reaction chamber, supplying carrier gas into the source chamber that may be configured to supply an evaporated organic source material into the reaction chamber, a temperature of the carrier gas ranging from 25° C. to 50° C., and spraying the carrier gas and the evaporated organic source material into the reaction chamber through a showerhead to deposit an organic scattering layer on the substrate, the organic scattering layer including organic particles, which may be provided in a molecularized form of the evaporated organic source material, and thereby having an uneven surface.

In example embodiments, the deposition apparatus may be an organic material vapor deposition apparatus.

In example embodiments, the reaction chamber may be controlled to have a pressure of about 1.6 Torr in the step of depositing the organic scattering layer.

In example embodiments, the showerhead may be provided in the reaction chamber and a temperature thereof may be controlled to range from about 200° C. to about 310° C. in the step of depositing the organic scattering layer.

In example embodiments, the forming of the organic scattering layer may further include supplying dilution gas into the reaction chamber.

In example embodiments, the substrate may be controlled to have a temperature of 0° C., in the step of depositing the organic scattering layer.

In example embodiments, the organic particles may be made of Tris(8-hydroxyquinolinato)aluminum ($Alq_3$).

According to other example embodiments of the inventive concepts, a method of fabricating an organic light-emitting diode may include forming an anode on a first substrate, forming an organic light-emitting layer on the anode, forming a cathode on the organic light-emitting layer, forming an organic scattering layer on a second substrate using one of the afore-described methods of fabricating an organic scattering layer, and bonding the second substrate on the cathode in such a way that the organic scattering layer and the cathode may be in contact with each other.

In example embodiments, the method may further include forming a protection layer on the cathode, before the bonding of the second substrate on the cathode.

In example embodiments, the method may further include forming an additional organic scattering layer below the first substrate, before the forming of the anode on the first substrate.

In example embodiments, the organic scattering layer may be made of Tris(8-hydroxyquinolinato)aluminum ($Alq_3$).

According to still other example embodiments of the inventive concepts, an organic light-emitting diode may include a substrate, an anode on the substrate, an organic light-emitting layer on the anode, a cathode on the organic light-emitting layer, and an organic scattering layer on the cathode. The organic scattering layer may include organic particles and thereby has an uneven surface.

In example embodiments, the organic scattering layer may be made of Tris(8-hydroxyquinolinato)aluminum ($Alq_3$).

In example embodiments, the organic light-emitting diode may further include a protection layer between the cathode and the organic scattering layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1A:
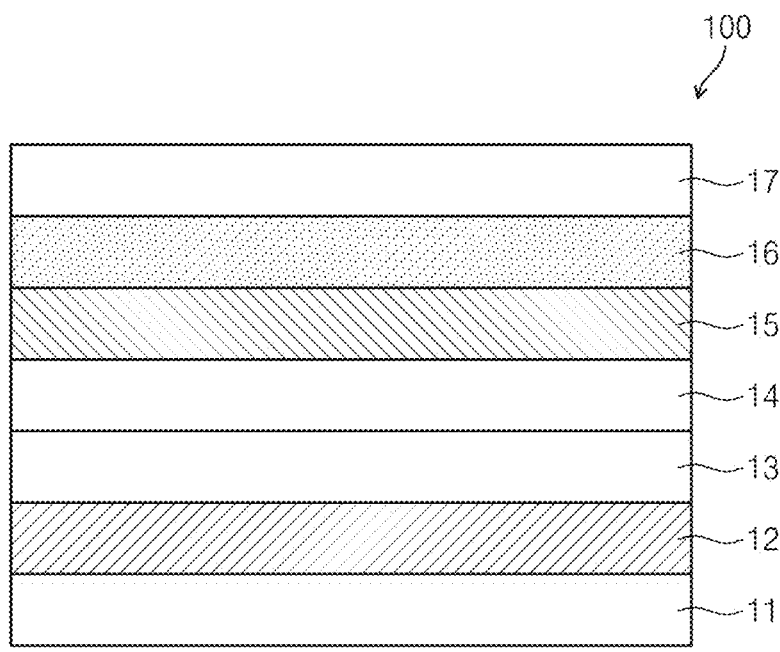
FIG. 1A is a sectional view illustrating an organic light-emitting diode with an organic scattering layer according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
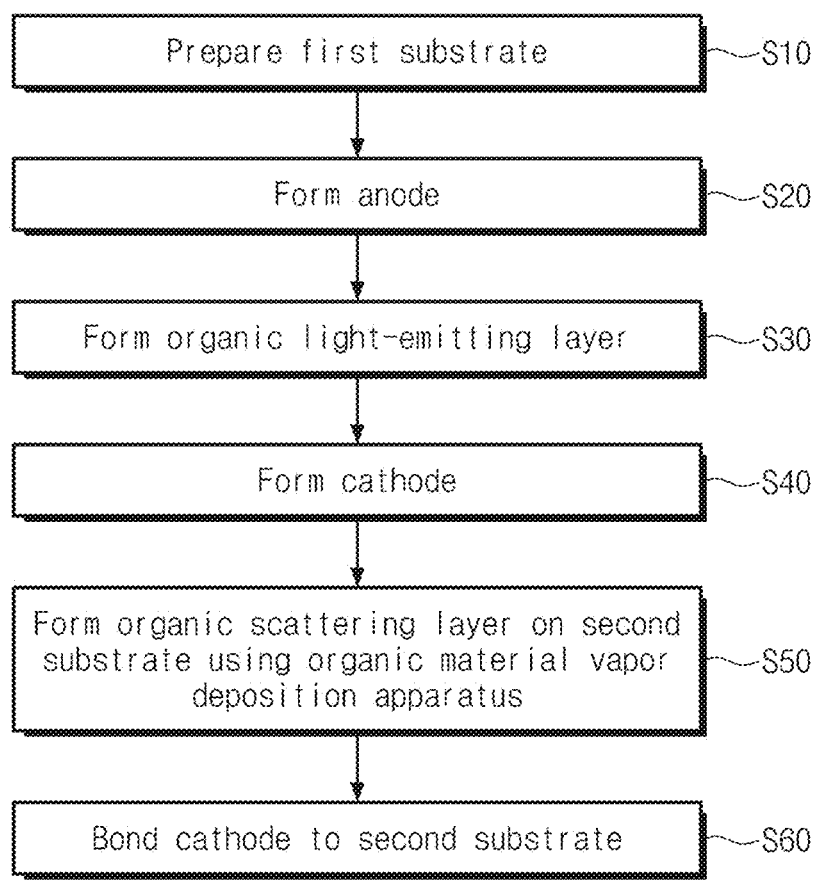
FIG. 1B is a flow chart illustrating a method of fabricating an organic light-emitting diode with an organic scattering layer according to example embodiments of the inventive concept.

FIG. 1A is a sectional view illustrating an organic light-emitting diode with an organic scattering layer according to example embodiments of the inventive concept. FIG. 1B is a flow chart illustrating a method of fabricating an organic light-emitting diode with an organic scattering layer according to example embodiments of the inventive concept.

Referring to FIGS. 1A and 1B, a first substrate 11 is prepared (in S10). The first substrate 11 may be formed of an optically transparent material. For example, the first substrate 11 may be a transparent substrate made of glass, plastic, or polymer.

An anode 12 may be formed on the first substrate 11 (in S20). The anode 12 may be a transparent electrode or a reflective electrode. In the case where the anode 12 is the transparent electrode, it may be formed of, for example, indium tin oxide (ITO), indium zinc oxide (IZO), or tin oxide.

In the case where the anode 12 is the reflective electrode, it may be formed of, for example, silver (Ag), aluminum (Al), nickel (Ni), platinum (Pt), or palladium (Pd).

An organic light-emitting layer 13 may be formed on the anode 12 (in S30). The organic light-emitting layer 13 may be configured to emit light. In example embodiments, the organic light-emitting layer 13 may be formed of Tris(8-hydroxyquinolinato)aluminum ($Alq_3$).

A cathode 14 may be formed on the organic light-emitting layer 13 (in S40). The cathode 14 may include a metal material. The cathode 14 may be formed of, for example, at least one of magnesium (Mg), calcium (Ca), aluminum (Al), silver (Ag), barium (Ba), or alloys thereof. The cathode 14 may be formed to be thin enough to allow light to pass through. In example embodiments, a protection layer 15 may be additionally formed on the cathode 14.

An organic scattering layer 16 may be formed on a second substrate 17 (in S50). The organic scattering layer 16 may be formed using an organic material vapor deposition apparatus, in which a homogeneous reaction can be carried out. The organic scattering layer 16 may include or be made of organic particles, and thus, the organic scattering layer 16 may have an uneven surface. The organic particles may have a size of several micrometers. In example embodiments, the organic particles may be $Alq_3$ particles. The second substrate 17 may be a deposition substrate for forming the organic scattering layer 16. The second substrate 17 may be a glass substrate, a $SiO_2$ substrate, or a polymer substrate. In other embodiments, the organic scattering layer 16 may be directly formed on the cathode 14. The formation of the organic scattering layer 16 will be described in more detail with reference to FIG. 4.

The second substrate 17 may be bonded to the cathode 14 (in S60). In example embodiments, the second substrate 17 may be bonded to the cathode 14 in such a way that the protection layer 15 is in contact with the organic scattering layer 16.

According to example embodiments of the inventive concept, light to be generated in the organic light-emitting layer 13 may be scattered by the organic particles in the organic scattering layer 16 and be emitted to the outside without a total reflection at an interface between the layers. Accordingly, an amount of light to be emitted to the outside can be increased in an organic light-emitting diode 100 with the organic light-emitting layer 13, compared with the conventional organic light-emitting diode, and this makes it possible to improve photoelectric efficiency of the organic light-emitting diode 100.

In addition, it is possible to form the organic scattering layer 16 using a low temperature process, and thus, the organic light-emitting diode 100 with the organic scattering layer 16 can be fabricated with a low cost.

Figure 2:
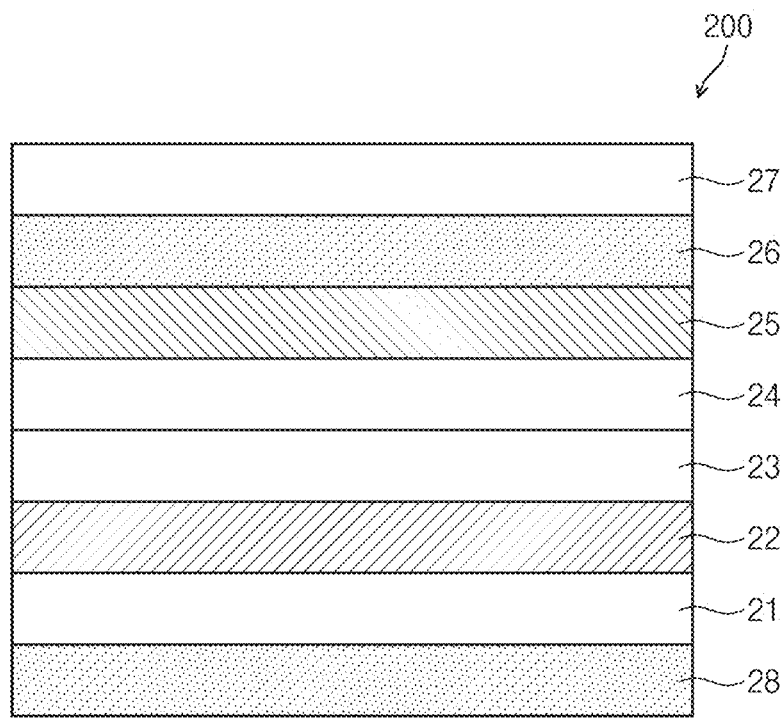
FIG. 2 is a sectional view illustrating an organic light-emitting diode with an organic scattering layer according to other example embodiments of the inventive concept.

FIG. 2 is a sectional view illustrating an organic light-emitting diode with an organic scattering layer according to other example embodiments of the inventive concept.

Referring to FIG. 2, an organic light-emitting diode 200 may include an anode 22, an organic light-emitting layer 23, a cathode 24, a protection layer 25, a first organic scattering layer 26, and a second substrate 27 that are provided on a first substrate 21.

The anode 22 may be transparent. In example embodiments, the anode 22 may be formed of, for example, indium tin oxide (ITO), indium zinc oxide (IZO), or tin oxide.

In other embodiments, if the anode 22 is the transparent electrode, light generated from the organic light-emitting layer 23 may be propagated toward the anode 22 and the cathode 24. In this case, a second organic scattering layer 28 may be provided below the first substrate 21.

Figure 3:
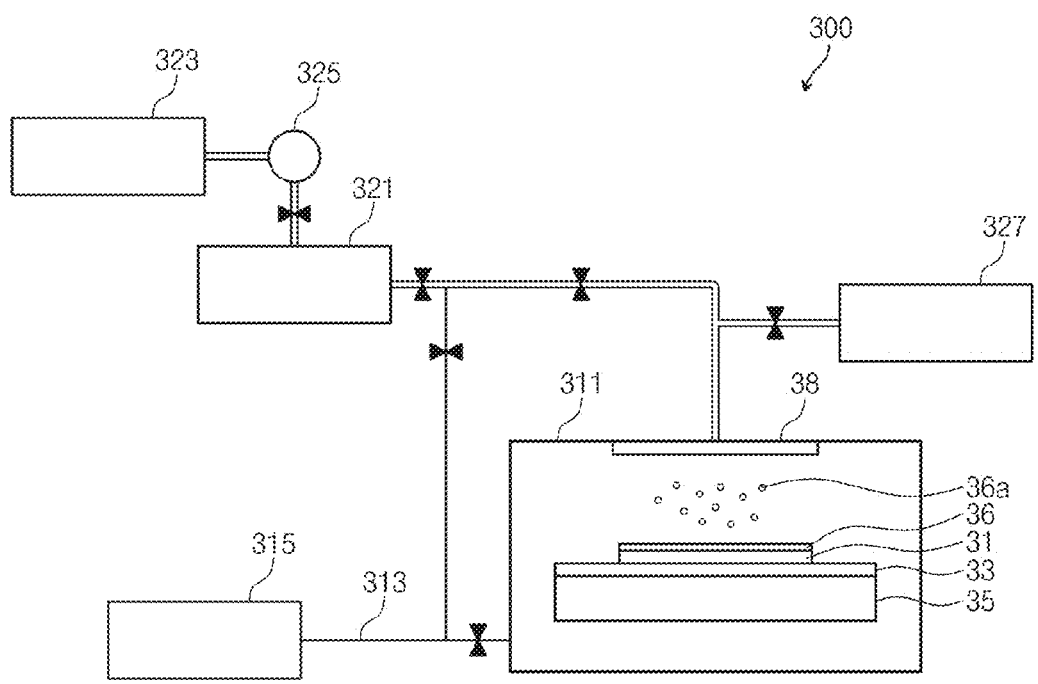
FIG. 3 is a diagram illustrating an organic material vapor deposition apparatus, which can be used to form an organic scattering layer according to example embodiments of the inventive concept.

FIG. 3 is a diagram illustrating an organic material vapor deposition apparatus, which can be used to form an organic scattering layer according to example embodiments of the inventive concept.

Referring to FIG. 3, an organic material vapor deposition apparatus 300 may include a reaction chamber 311, which may be configured to form an organic scattering layer 36. In example embodiments, a substrate supporting part 33, a temperature controlling part 35, and a showerhead 38 may be provided in the reaction chamber 311. The substrate supporting part 33 may be configured to support a substrate 31, and the temperature controlling part 35 may be provided near the substrate supporting part 33 and be configured to control a temperature of the substrate 31. The showerhead 38 may be provided to face the substrate supporting part 33 and be configured to spray uniformly an organic source material onto the substrate 31.

According to example embodiments of the inventive concept, the substrate 31 may be loaded in the reaction chamber 311. During the deposition of the organic material, the substrate 31 may be at a temperature of about 0° C. and the showerhead 38 may be heated to a temperature of about 200-310° C.

The substrate 31 may be cleaned, before it is loaded in the reaction chamber 311. The substrate 31 may be one of a glass substrate, a $SiO_2$ substrate, or a polymer substrate. In the case of the polymer substrate, it may be formed of, for example, polyimide. The cleaning of the substrate 31 may be performed with piranha solution for 10 minutes using an ultrasonic cleaner. Thereafter, the substrate 31 may be washed, for 10 minutes, with running water. Next, the substrate 31 may be cleaned, for 10 minutes, with acetone and isopropyl alcohol, respectively, using an ultrasonic cleaner, and then be dried using a nitrogen gun.

The reaction chamber 311 may be connected to a vacuum pump 315 through a vacuum exhaust conduit 313. The vacuum pump 315 may be used to vacuumize the reaction chamber 311 to a specific vacuum pressure. In example embodiments, the vacuum pump 315 may be operated in such a way that the reaction chamber 311 has a deposition pressure of about 1.6 Torr.

A source chamber 321 may be connected to the reaction chamber 311 to supply an evaporated organic source material. For example, the source chamber 321 may be connected to the showerhead 38 of the reaction chamber 311. If a layer to be deposited is made of a plurality of organic source materials, a plurality of source chambers 321 may be connected in parallel to the reaction chamber 311. In example embodiments, an organic material stored in the source chamber 321 may contain Tris(8-hydroxyquinolinato)aluminum ($Alq_3$). An inner temperature of the source chamber 321 may be maintained to about 340° C.

The source chamber 321 may be connected to a carrier gas supplier 323. The carrier gas supplier 323 may be configured to supply carrier gas into the source chamber 321. To control precisely an amount of the carrier gas flowing into the source chamber 321, a mass flow controller 325 may be provided between the carrier gas supplier 323 and the source chamber 321. The carrier gas may include, for example, at least one of nitrogen or inert gas (such as helium, argon, krypton, xenon, or neon). The carrier gas may flow from the carrier gas supplier 323 to the reaction chamber 311 through the source chamber 321, and thus, the evaporated organic source material in the source chamber 321 may be delivered into the reaction chamber 311. The source chamber 321 may be configured to evaporate the organic source material and produce vapor of organic material, and the evaporated organic material may be delivered into the reaction chamber 311 by the carrier gas. In example embodiments, a temperature of the carrier gas may be maintained to about 25-50° C., when the carrier gas is supplied into the source chamber 321. A flow rate of the carrier gas to be supplied into the reaction chamber may range from about 500 sccm to about 1000 sccm. The temperature and flow rate of the carrier gas may be changed depending on what kind of the organic source material is in use.

The reaction chamber 311 may be connected to a dilution gas supplier 327. The dilution gas supplier 327 may be configured to supply dilution gas into the reaction chamber 311, when the vapor of the organic source material is supplied into the reaction chamber 311. The dilution gas may be, for example, nitrogen gas or argon gas.

The carrier gas and the evaporated organic source material supplied into the source chamber 321 may be sprayed into the reaction chamber 311 through the showerhead 38. As the result of the spraying of the evaporated organic source material, organic particles 36a may be produced in the reaction chamber 311 and be deposited onto the substrate 31 to form the organic scattering layer 36.

In example embodiments, the organic particles 36a may be formed through a homogeneous reaction. In the homogeneous reaction, the vaporized organic source materials may be molecularized to form organic particles in the air. In this case, the organic particles 36a may be directly deposited on the substrate 31 to form the organic scattering layer 36. The organic scattering layer 36 may have pores between the organic particles 36a, and thus, it may have an uneven surface.

In the case that the organic layer is formed using a conventional organic material deposition apparatus, the organic material deposition apparatus may be operated at a deposition condition, in which a temperature of the carrier gas is maintained to about 100-200° C. That is, in the case of the use of the conventional organic material deposition apparatus, a high temperature process is needed to form the organic layer.

By contrast, in the case where the organic scattering layer 36 is formed using the organic material vapor deposition apparatus 300, it is possible to form the organic scattering layer 36 using the carrier gas at room temperature. This makes it possible to form the organic scattering layer 36 with a low temperature process and low cost.

Figure 4:
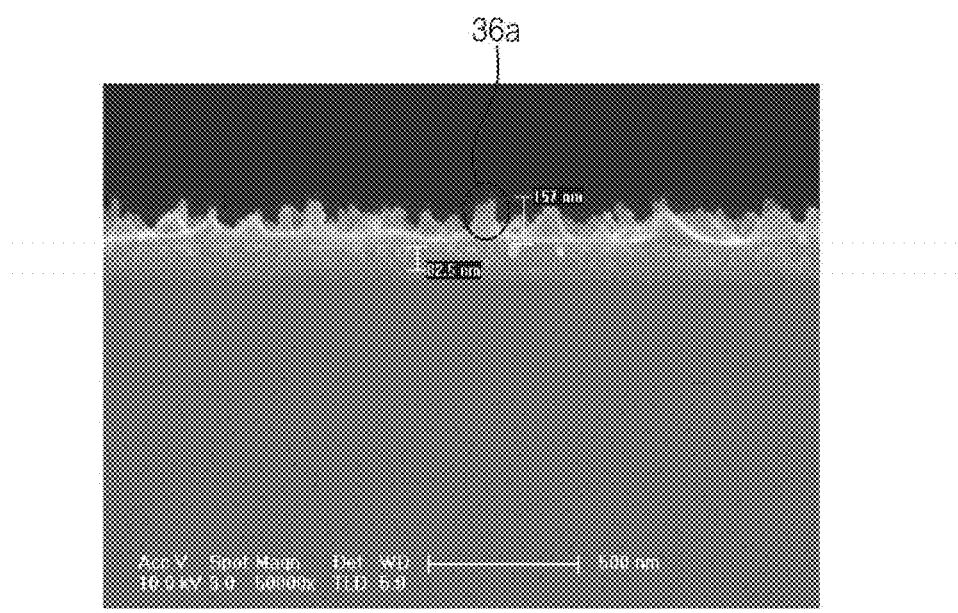
FIG. 4 is a scanning electron microscope (SEM) image of an organic scattering layer that was formed using the organic material vapor deposition apparatus according to example embodiments of the inventive concept.

FIG. 4 is a scanning electron microscope (SEM) image of an organic scattering layer that was formed using the organic material vapor deposition apparatus according to example embodiments of the inventive concept.

Referring to FIG. 4, the process described with reference to FIG. 3 was performed to form an organic scattering layer on a glass substrate. The organic scattering layer was made of Tris(8-hydroxyquinolinato)aluminum (Alq$_3$). As shown in FIG. 4, the organic scattering layer had the organic particles 36a having a size ranging from about 1 μm to about 2 μm.

Figure 5:
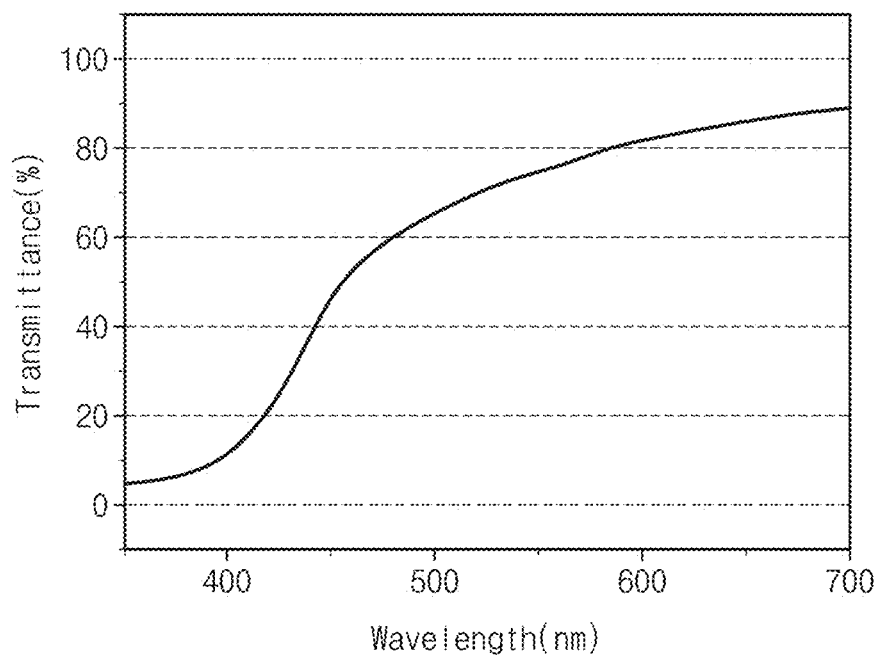
FIG. 5 is a graph showing transmittance of the organic scattering layer that was formed using the organic material vapor deposition apparatus according to example embodiments of the inventive concept.

FIG. 5 is a graph showing transmittance of the organic scattering layer that was formed using the organic material vapor deposition apparatus according to example embodiments of the inventive concept.

The graph of FIG. 5 was obtained from an Alq$_3$ layer formed using the process described with reference to FIG. 3. As shown in FIG. 5, transmittance of the Alq$_3$ layer was decreased in the visible range, as the result of the presence of the small organic particles in the organic scattering layer.

According to example embodiments of the inventive concept, an organic material vapor deposition apparatus is used to form an organic scattering layer. The use of the organic material vapor deposition apparatus makes it possible to maintain a temperature of carrier gas to about 50° C. or less, during the formation of the organic scattering layer. Accordingly, it is possible to form the organic scattering layer using low temperature process and with low cost. The organic scattering layer may be provided on a protection layer of an organic light-emitting diode, and thus, the organic light-emitting diode can have improved quantum efficiency.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating an organic light-emitting diode, comprising:
   forming an anode on a first substrate;
   forming an organic light-emitting layer on the anode;
   forming a cathode on the organic light-emitting layer;
   forming an organic scattering layer on a second substrate; and
   bonding the second substrate and the cathode in such a way that the organic scattering layer and the cathode are disposed adjacent to each other,
   wherein the forming of the organic scattering layer includes:
      providing a deposition apparatus with a reaction chamber and a source chamber;
      loading a substrate in the reaction chamber;
      supplying carrier gas into the source chamber that is configured to supply an evaporated organic source material into the reaction chamber, a temperature of the carrier gas ranging from 25° C. to 50° C.; and
      spraying the carrier gas and the evaporated organic source material into the reaction chamber through a showerhead to deposit the organic scattering layer on the substrate, the organic scattering layer comprising organic particles, which are provided in a molecularized form of the evaporated organic source material, and thereby having an uneven surface.

2. The method of claim 1, further comprising forming a protection layer on the cathode, before the bonding of the second substrate on the cathode.

3. The method of claim 1, further comprising forming an additional organic scattering layer below the first substrate, before the forming of the anode on the first substrate.

4. The method of claim 1, wherein the organic scattering layer is made of Tris(8-hydroxyquinolinato)aluminum (Alq3).

5. The method of claim 1, wherein the deposition apparatus is an organic material vapor deposition apparatus.

6. The method of claim 1, wherein the reaction chamber is controlled to have a pressure of about 1.6 Torr during spraying to deposit the organic scattering layer.

7. The method of claim 1, wherein the showerhead is provided in the reaction chamber and a temperature thereof is controlled to range from about 200° C. to about 310° C. during spraying to deposit the organic scattering layer.

8. The method of claim 1, wherein spraying to deposit the organic scattering layer further comprises supplying dilution gas into the reaction chamber.

9. The method of claim 1, wherein the substrate is controlled to have a temperature of 0° C. during spraying to deposit the organic scattering layer.

* * * * *